(12) United States Patent
Conn

(10) Patent No.: US 6,756,305 B1
(45) Date of Patent: Jun. 29, 2004

(54) STACKED DICE BONDED WITH ALUMINUM POSTS

(75) Inventor: Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/405,789

(22) Filed: Apr. 1, 2003

(51) Int. Cl.⁷ ................................................ H01L 21/44
(52) U.S. Cl. ........................................ 438/667; 257/686
(58) Field of Search ................................ 438/107–109, 438/128, 613, 455–458, 666–668; 257/686, 724, 773–774, 776–777, 797

(56) References Cited

U.S. PATENT DOCUMENTS

| | | | |
|---|---|---|---|
| 6,093,029 A | * | 7/2000 | Kwon et al. ................... 439/69 |
| 6,114,221 A | | 9/2000 | Tonti et al. |
| 6,245,594 B1 | | 6/2001 | Wu et al. |
| 6,271,059 B1 | | 8/2001 | Bertin et al. |
| 6,368,930 B1 | | 4/2002 | Enquist |
| 6,410,431 B2 | | 6/2002 | Bertin et al. |
| 6,444,560 B1 | | 9/2002 | Pogge et al. |
| 6,643,434 B2 | * | 11/2003 | Cayrefourcq et al. ......... 385/52 |
| 2002/0064906 A1 | | 5/2002 | Enquist |

OTHER PUBLICATIONS

Alex Romanelli, "Intel Stacks Flash Deck in its Favor," Electronic News, Apr. 10, 2003, available from Reed Electronics Group @ http://www.e-insite.net/electronicnews/index.asp?layout=article&articleid=CA291318.

* cited by examiner

Primary Examiner—David Nelms
Assistant Examiner—David Vu
(74) Attorney, Agent, or Firm—T. Lester Wallace; Edel M. Young; Justin Liu

(57) ABSTRACT

A die assembly contains multiple stacked dice bonded together by a large number of metal posts. A first die has a plurality of metal posts oriented orthogonally to a planar surface of the first die. The metal posts protrude from the first die out beyond the surface. Similarly, a second die also has a plurality of metal posts protruding from a surface. The first die is coupled to the second die in an oxygen-free atmosphere such that each protruding metal post of the first die contacts a protruding metal post of the second die. By applying pressure, cold welds are formed between corresponding metal posts of the first and second dice. The first die and the second die are held together by the metal posts without an adhesive. In one embodiment, some of the metal posts do not conduct signals between the first and second dice.

23 Claims, 4 Drawing Sheets

STACKED DICE BONDED WITH ALUMINUM POSTS

FIELD OF THE INVENTION

The present invention relates to multi-chip devices, and specifically to a method of bonding and electrically connecting dice within a stacked-die assembly.

BACKGROUND INFORMATION

Programmable logic devices can operate at faster speeds by increasing semiconductor device density. Besides more densely mapping circuitry on two-dimensional layers of semiconductor dice, semiconductor density can be further increased by stacking semiconductor dice. Stacked-die assemblies permit a three-dimensional interconnection of circuitry and thereby an even greater semiconductor device density.

Various methods of interconnecting and bonding dice in stacked-die assemblies have been developed. Some of these methods involve bonding the dice using adhesives. The adhesives add to the volume of the die assemblies and limit the area available to interconnect the dice. Other methods use wire bonding to interconnect circuitry on different dice. The relatively large wire bonds limit the three-dimensional density of circuitry in the stacked-die assemblies. Other methods use micropad structures disposed on each die, wherein a micropad on one die comes into contact with a corresponding micropad on the other die when the two dice are stacked. Examples of micropad structures and stacked-die assembly processes are found in U.S. Pat. Nos. 6,271,059, 6,114,221, 6,410,431, 6,444,560, 6,245,594, 6,368,930, as well as in published U.S. patent application Ser. No. 2002/0064906. Some stacked-die assembly processes involve fusing micropads together at elevated temperatures. See, for example, the article by Banerjee et al., entitled "3D ICs: A Novel Chip Design for Improving Deep-Submicrometer Interconnect Performance and Systems-on-Chip Integration," Proceedings of the IEEE, vol. 89, No. 5, May 2001.

An alternative to these methods is sought that permits high three-dimensional density of circuitry within a programmable logic device.

SUMMARY

A die assembly contains multiple stacked dice bonded together by a plurality of metal posts. A first die has a plurality of metal posts oriented orthogonally to a planar first outer surface of the first die. The metal posts protrude from the first die out beyond the first outer surface. Similarly, a second die has a plurality of metal posts protruding from a second outer surface of the second die. The first die is coupled to the second die in a stacked relation such that each metal post protruding from the first outer surface of the first die contacts a metal post protruding from the second outer surface of the second die. The metal posts are prepared so as to be oxide free. Then this stacking is performed in an oxygen-free atmosphere so that the metal posts of the first die are cold welded to the metal posts of the second die when the first and second dice are pressed together. After cold welding, the first die and the second die are held together without an adhesive by many weak covalent bonds between the metal posts. In one embodiment, the surface of the first die does not contact the surface of the second die at locations other than the metal posts. In addition to bonding the first and second dice together, contacting metal posts can be used to communicate electrical signals between the dice.

Semiconductor dice are stacked and bonded in a method that includes forming metal vias on a first die, and etching away a portion of the metal vias to form metal posts. The top protruding end of each of the metal posts is disposed below the outer surface of the first die. A layer of the first die is then etched away such that the protruding end of each of the metal posts protrudes out from the outer surface of the first die. The method further includes forming protruding metal posts on a second die in a similar manner. The first die and the second die are then stacked such that the protruding end of each metal post of the first die contacts the protruding end of a corresponding metal post of the second die. This stacking operation is performed in an oxygen-free atmosphere such that the protruding ends of the metal posts do not oxidize. Pressure is applied to compress the first die and the second die such that a cold weld is formed between each metal post of the first die and a corresponding metal post of the second die. In one embodiment, the pressure applied to compress the first die and the second die does not bring the first outer surface of the first die in contact with the second outer surface of the second die.

Additional novel aspects and embodiments are described in the detailed description below. The claims, and not this summary, define the scope of the invention.

BRIEF DESCRIPTION OF THE DRAWINGS

The accompanying drawings illustrate embodiments of the invention, where like numerals indicate like components.

DETAILED DESCRIPTION OF THE DRAWINGS

Figure 1:
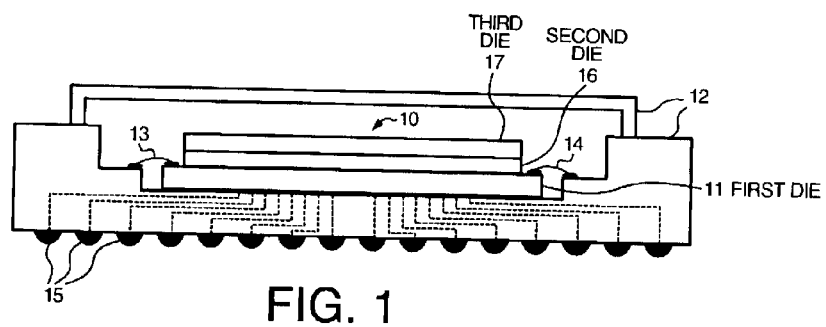
FIG. 1 is a simplified cross sectional diagram of a die assembly in a package in accordance with one embodiment of the present invention.

FIG. 1 is a simplified cross sectional diagram of a die assembly 10 in accordance with a first embodiment of the present invention. In this example, a first die 11 is mounted in a package 12. Package 12 is described here to illustrate one possible configuration, although the present invention is usable with many types of packages. First die 11 contains circuitry disposed on a silicon substrate. In this example, first die 11 is a field programmable gate array (FPGA) die. Wire bonds 13 and 14 connect the circuitry on first die 11 to package 12. Input leads and output leads of the circuitry are coupled through the package to a printed circuit board (not shown) or another electronic device via solder bumps 15 on the bottom surface of package 12.

Package 12 also contains a second die 16 and a third die 17. Second die 16 is stacked on top of first die 11, and third die 17 is stacked on top of second die 16. In this example, each of second die 16 and third die 17 is a programmable read only memory (PROM) die. Thus, package 12 contains two PROM dice stacked upon an FPGA die.

Figure 2:
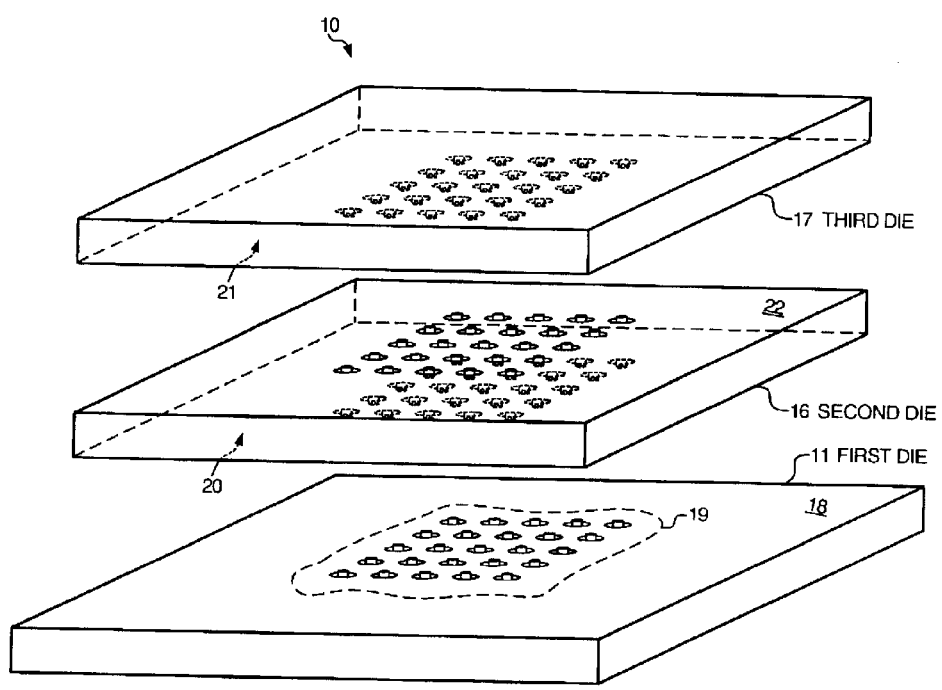
FIG. 2 is a simplified perspective schematic diagram of two dice of the die assembly of FIG. 1.

FIG. 2 is a simplified perspective exploded schematic diagram of one example of first die 11, second die 16 and third die 17 of FIG. 1. First outer surface 18 is a substantially planar top surface of first die 11. First outer surface 18 is, for example, comprised of silicon dioxide or silicon nitride. Multiple metal posts 19 protrude through first outer surface 18. Metal posts 19 are, for example, comprised of aluminum. One end of each of the metal posts 19 extends upward beyond the plane of first outer surface 18. Around each of the metal posts 19 is a trough.

A second outer surface 20 is a substantially planar bottom surface of second die 16. Similar to metal posts 19, multiple aluminum metal posts protrude downward through second outer surface 20. A third outer surface 21 is a substantially planar bottom surface of third die 17. Similar to metal posts 19, multiple aluminum metal posts protrude downward through third outer surface 21. Finally, a fourth outer surface 22 is a substantially planar top surface of second die 16. Similar to metal posts 19, multiple aluminum metal posts protrude upward through fourth outer surface 22.

Each of the metal posts 19 of the first die 11 is aligned with a corresponding metal post on second die 16 that protrudes downward through second outer surface 19. Each metal post that protrudes upward through fourth outer surface 22 of the second die 16 is aligned with a corresponding metal post that protrudes downward through the third outer surface 21 of third die 17.

Figure 3:
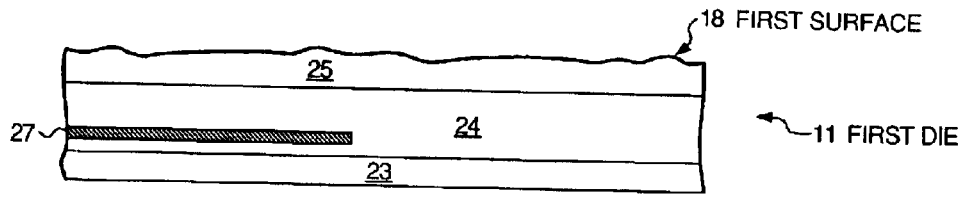
FIG. 3 is a simplified cross sectional diagram of a die showing various layers.

FIG. 3 is a simplified cross-sectional diagram of first die 11 showing a layer 23 of metallization and insulation sublayers, a top insulating layer 24 of the metallization and insulation sublayers, and an insulating passivation layer 25. Each layer of first die 11 is substantially planar. In this example, passivation layer 25 is formed of silicon dioxide. In another example, passivation layer 25 is formed of silicon nitride. First outer surface 18 is also the outer surface of passivation layer 25. A metallization layer 27 extends within a portion of top insulating layer 24.

Figure 4:
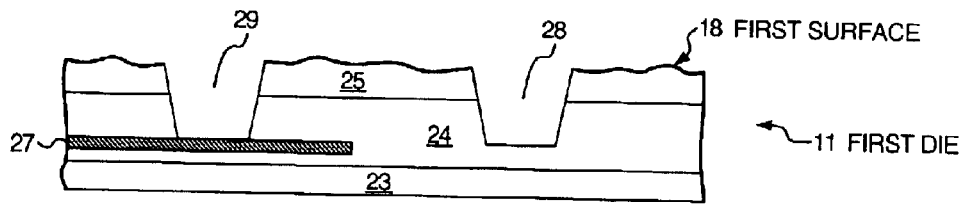
FIG. 4 is a simplified cross sectional diagram of the die of FIG. 3 illustrating a step in which vias are etched.

FIG. 4 illustrates an initial step in a method for stacking dice. In the initial step, many vias are etched through first outer surface 18 into first die 11. In this example, one via 28 is etched down through passivation layer 25 into top insulation layer 24. Another via 29 is also etched through passivation layer 25 into insulation layer 24. Via 29, however, is etched into a portion of insulation layer 25 that contains metallization layer 27. Via 29 is etched down to expose a portion of metallization layer 27.

Figure 5:
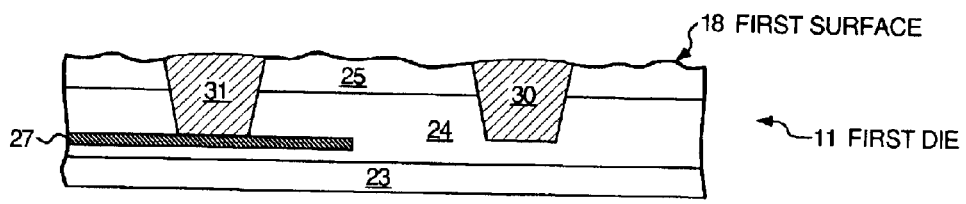
FIG. 5 is a simplified cross sectional diagram of the die of FIG. 4 illustrating a step in which metal vias are formed.

FIG. 5 illustrates a subsequent step in which metal is deposited into many vias, including via 28 and via 29. Metal vias 30 and 31 (sometimes called plugs) are formed. In this example, aluminum is deposited into the many vias. In other examples, copper or tungsten are deposited into the vias.

Figure 6:
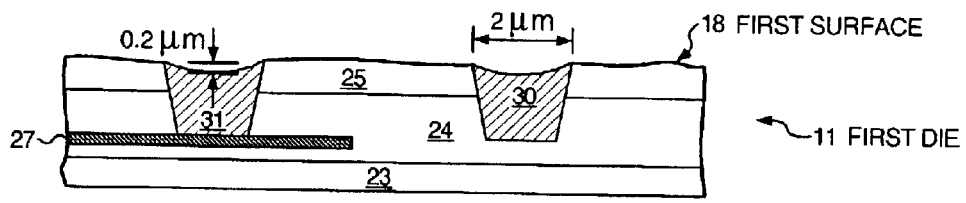
FIG. 6 is a simplified cross sectional diagram of the die of FIG. 5 after a polishing step.

In FIG. 6, excess metal that remains above first outer surface 18 has been removed in a later step using chemical-mechanical polishing (CMP). Polishing also makes the first outer surface 18 smoother. The non-planarity of first outer surface 18 in FIG. 6 is for illustrative purposes only and is not meant to indicate a corresponding degree of roughness. As the aluminum of the metal vias 30 and 31 is softer than the silicon dioxide of first outer surface 18, "dishing" may occur where metal vias 30 and 31 reach first outer surface 18 of first die 11. Viewed from the polished first outer surface 18, concave indentations may form above each metal via. In this example, each metal via, including metal vias 30 and 31, has a diameter of about 2 microns. The depth of the dishing of an aluminum via is about one tenth of its diameter. Thus, the bottom of the concave "dish" of each of metal vias 30 and 31 is about 0.2 microns from the plane of first outer surface 18.

Figure 7:
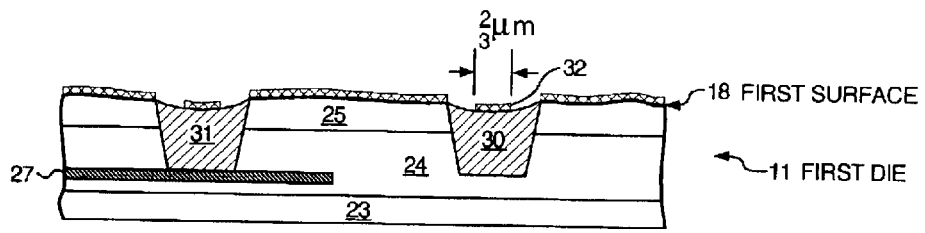
FIG. 7 is a simplified cross sectional diagram of a die illustrating a step in which the polished surface of FIG. 6 is masked with photoresist.

FIG. 7 shows how the polished first outer surface 18 is masked with photoresist and patterned in a subsequent step, leaving a donut-shaped opening over each metal via. Thus, a disk 32 of photoresist covers the center of the concave indentation on top of metal via 30. Each disk of photoresist is about one third the diameter of the corresponding metal via. Thus, the diameter of disk 32 is about two thirds of a micron.

Figure 8:
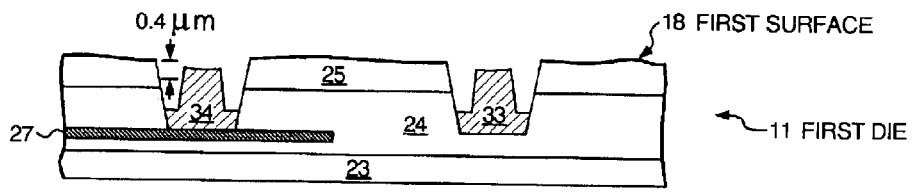
FIG. 8 is a simplified cross sectional diagram of the die of FIG. 7 after a step in which metal posts are formed by etching metal vias.

In a subsequent step, the unmasked parts of the metal vias are etched away, leaving metal posts. This etching may, for example, be ion beam etching (IBE), plasma etching, reactive ion beam etching or wet etching. The resulting metal posts are axially oriented substantially orthogonal to the plane of first outer surface 18. Metal via 30 becomes metal post 33. Metal via 31 becomes metal post 34. Metal posts 33 and 34 have substantially vertical sides. To some extent, however, the sides of both wide vias 28 and 29 and metal posts 33 and 34 form obtuse angles with the plane of first outer surface 18. After etching, the photoresist mask is removed. The resulting structure is shown in FIG. 8.

Figure 9:
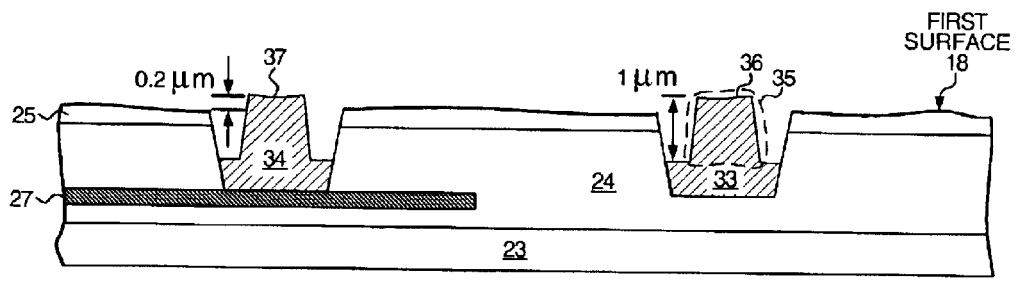
FIG. 9 is a simplified cross sectional diagram of a die illustrating a step in which a passivation layer is etched down below a protruding end of a metal post.

FIG. 9 illustrates a subsequent step in which passivation layer 25 is etched down such that metal posts 33 and 34 protrude above the plane of first outer surface 18. The amount of passivation layer 25 that is etched away is shown in FIG. 8. The bottom of the concave "dish" on the top of the metals vias 30 and 31 has become the top of the protruding end of metal posts 33 and 34. Passivation layer 25 is etched down in an amount about twice the distance between the original height of first outer surface 18 and the bottom of the "dish" of metal vias 30 and 31. In this example, the passivation layer 25 is etched down about 0.4 microns, as illustrated in FIG. 8. Passivation layer 25 can be selectively etched by using, for example, hydrogen fluoride, so that no masking layer is used. FIG. 9 shows the resulting protruding ends 36 and 37 of metals posts 33 and 34, respectively. Protruding ends 36 and 37 now extend above the plane of first outer surface 18 by about 0.2 microns.

Each orthogonally oriented metal post, including metal post 33, has a narrower cylindrical portion adjacent to its protruding end. The cylindrical portions are approximately one to two microns long (in the vertical direction). A one-micron-tall cylindrical portion 35 is adjacent to protruding end 36 on metal post 33. Longer cylindrical portions permit the protruding ends of the metal posts to flex laterally in relation to the outer surfaces of the dice. In a later step where first die 11 is bonded to second die 16 by metal posts 33 and 34, the longer cylindrical portions permit movement of areas on the bonded dice that exhibit differential thermal expansion. In this embodiment, the cross-sectional area of the cylindrical portion 35 where the plane of first surface 18 intersects cylindrical portion 35 is less than 0.35 square microns.

Figure 10:
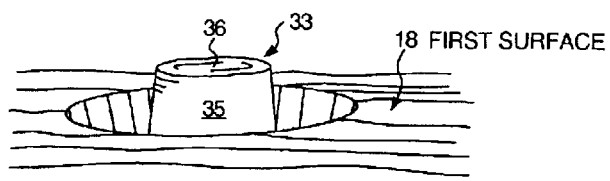
FIG. 10 is a simplified perspective schematic diagram of a metal post protruding from a surface of a die.

FIG. 10 is an expanded perspective view of protruding end 36 of metal post 33. Although in FIG. 2 only twenty-five of such metal posts 19 are shown protruding from first outer surface 18, in a commercial embodiment first die 11 may have one hundred thousand metal posts or more.

Figure 11:
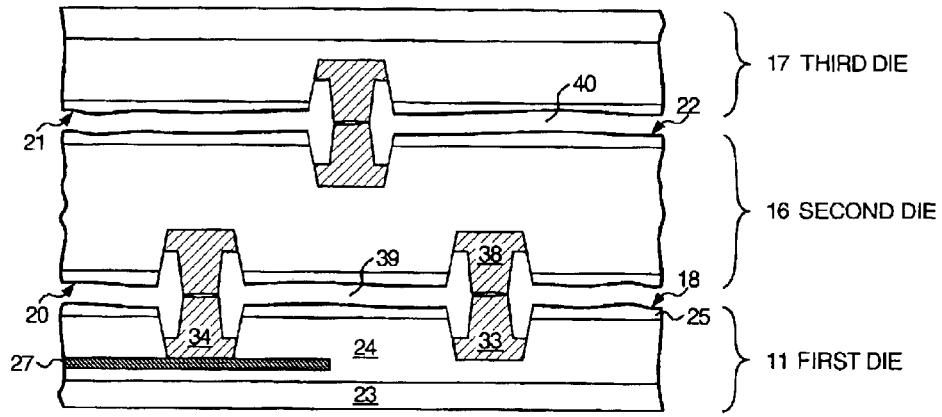
FIG. 11 is a simplified cross sectional diagram of stacked dice in which metal posts of one die contact metal posts of another die.

FIG. 11 illustrates a subsequent step in which first die 11, second die 16 and third die 17 are stacked. In an analogous manner to the steps described above, multiple metal posts are formed in second die 16, protruding downward through second outer surface 20 and upward through fourth outer surface 22. In addition, multiple metal posts are formed in third die 17, protruding downward through third outer surface 21.

Each metal post protruding through first outer surface 18 is aligned so that it contacts a corresponding metal post that protrudes through second outer surface 20. FIG. 1 shows that metal post 33 comes in contact with a metal post 38 that protrudes downward through second outer surface 20. Even after the metal post 33 comes in contact with metal post 38, a gap 39 remains between first outer surface 18 and second outer surface 20. In a similar manner, each metal post protruding through third outer surface 21 is aligned so that it contacts a corresponding metal post that protrudes through fourth outer surface 22. A gap 40 remains between third outer surface 21 and fourth outer surface 22. The surfaces do not have to be extremely flat. The posts will accommodate 0.2 to 0.4 microns of non-flatness. Under good clean conditions, a "light" touch is all that's needed to make a bond. The pressure is mostly to deal with some lack of planarization. Some posts will deform more than others to accommodate different post heights. Thus in some regions of the die, there may be considerable compression of the posts, and in other areas hardly any.

The protruding ends of the metal posts do not have contours that render them self-aligning. Commercially available pick and place equipment is used to align first die 11, second die 16 and third die 17 to within less than one micron accuracy. Some pick and place equipment can achieve alignment within 0.1 micron.

The steps shown in FIGS. 8, 9 and 11 are performed in the absence of oxygen. Once the metal vias are etched to form the metal posts, the metal posts are kept in an oxygen-free atmosphere (for example, a nitrogen atmosphere) to prevent the formation of aluminum oxide on the exposed surfaces of the metal posts and to facilitate cold welding in a subsequent step.

Figure 12:
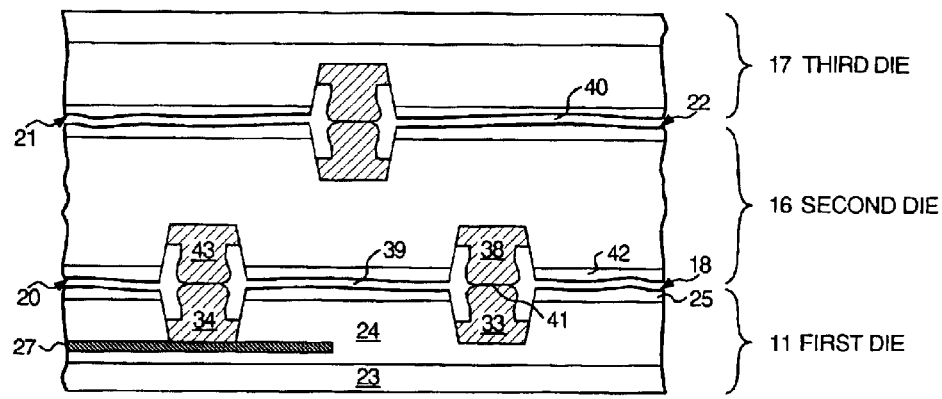
FIG. 12 is a simplified cross sectional diagram of dice bonded by metal posts, where gaps remain between the bonded dice.

FIG. 12 illustrates a subsequent step in which pressure is applied to the stacked dice of FIG. 11. This step is also performed in the absence of oxygen. Care is taken to ensure that the contacting protruding ends of the metal posts are not covered with a crust of aluminum oxide. In the first embodiment, first die 11, second die 16 and third die 17 are compressed with approximately 0.5 pounds of pressure. Although deformation of the metal posts is not required to form the cold welds, deformation of some metal posts sometimes occurs where the protruding ends of the metal posts are not all in an exact plane. An interface 41 where a cold weld is formed between metal post 33 and metal post 38 is shown in FIG. 12.

The aluminum of the metal posts has a tensile strength of approximately 10,000 PSI. Each post has a 0.66 micron diameter. The combined tensile strength of the approximately 100,000 aluminum cold welds between first die 11 and second die 16 is about 0.5 pounds. Thus, first die 11 and second die 16 are held together without an adhesive by many weak covalent bonds between the metal posts.

FIG. 12 also shows that the pressure applied to the dice deforms the metal posts and thereby reduces their height. For example, in FIG. 11, prior to the application of pressure, metal post 33 protrudes 0.2 microns above first outer surface 18, and metal post 38 protrudes 0.2 microns below second outer surface 20, resulting in gap 39 being 0.4 micron wide between first outer surface 18 and second outer surface 20. The volume of the trough around an aluminum post is sufficient to accommodate the deformed aluminum such that the surrounding material of passivation layer 25 is not stressed or cracked. After pressure is applied, gap 39 is reduced. In the embodiment shown in FIG. 12, although the width of gap 39 is reduced after pressure is applied, a space nevertheless remains and the silicon dioxide of first outer surface 18 does not contact the silicon dioxide of second outer surface 20. Thus, first die 11 and second die 16 are not held together by covalent bonding of the entire first outer surface 18 to second outer surface 20.

By retaining a slight gap 39 between first outer surface 18 and second outer surface 20, a thermal gradient can be maintained between insulating passivation layer 25 on first die 11 and an analogous passivation layer 42 on second die 16. Thermal stresses caused by circuitry within different stacked dice generating different amounts of heat are thereby relieved Although many metal posts described in the first embodiment are used to bond stacked dice to each other, pairs of metal posts can also be used to communicate electrical signals between stacked dice. For example, circuitry on first die 11 is coupled to metallization layer 27. After metal post 34 is cold welded to a metal post 43 on second die 16, the circuitry on first die 11 is electrically connected to circuitry on second die 16 through metals posts 34 and 43.

Figure 13:
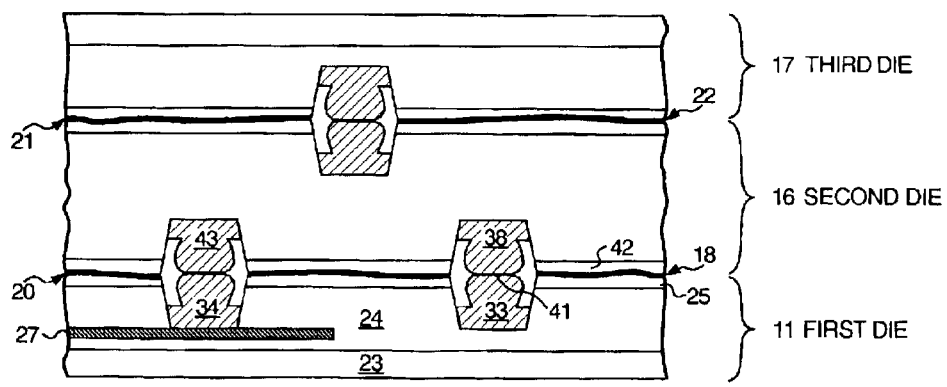
FIG. 13 is a simplified cross sectional diagram of dice bonded by metal posts, where no gaps remain between the bonded dice.

FIG. 13 illustrates a step of a second embodiment in which pressure is applied to the stacked dice of FIG. 11. In this second embodiment, more pressure is applied to compress first die 11, second die 16 and third die 17 than is applied in the step shown in FIG. 12. The pressure applied to the dice is sufficient to reduce the height of the metal posts such that the gaps 39 and 40 of FIG. 12 are eliminated. The silicon dioxide of first outer surface 18 contacts the silicon dioxide of second outer surface 20. In addition to the aluminum bonds between the metal posts, first die 11 and second die 16 may also be partially held together by weak covalent silicon dioxide bonding between the first outer surface 18 of the first die 11 and the second outer surface 20 of the second die 16.

Although for instructional purposes the present invention is described in connection with certain specific embodiments, the present invention is not limited thereto. The outer surface of a die through which the protruding ends of metal posts extend does not have to be a passivation layer, but rather can be another layer of the die including an insulating layer or a metal layer. And although metal posts are described above as providing structural connection between two dice, another embodiment can be produced in which all metal posts provide electrical as well as structural connection between the dice. Dice can be bonded together by touching planar small protrusions of two parallel metal layers together so that the small protrusions of two metal layers touch and cold weld to one another. In some embodiments, the protruding ends of metal posts are allowed to oxidize, but immediately before die stacking, the oxide is removed. Alignment structures that are larger than the metal posts can be provided on the mating dice to facilitate alignment of the metal posts to one another during stacking. Self-aligning metal posts can also be used. The protruding ends of the metal posts on a first die can protrude beyond the outer surface of the first die, whereas the ends of the metal posts on the second die do not protrude beyond the outer surface of the second die. The protruding ends of the first die therefore fit into the recesses containing the posts on the second die so that the first and second die fit together in a self-aligning manner. Although dice are described above as being cold welded together, the same process can be performed as described above except that the process is carried out at an elevated temperature. Accordingly, various modifications, adaptations, and combinations of various features of the described embodiments can be practiced without departing from the scope of the invention as set forth in the following claims.

What is claimed is:

1. A die assembly, comprising:
 a first die having a first plurality of metal posts, the first die having a substantially planar first outer surface, each of the first plurality of metal posts having a volume and a protruding end and being oriented substantially orthogonally to the first outer surface, most of the volume of each of the first plurality of metal posts being located beneath the first outer surface, the protruding end of each of the first plurality of metal posts protruding beyond the first outer surface; and
 a second die having a second plurality of metal posts, the second die having a substantially planar second outer surface, each of the second plurality of metal posts having a volume and a protruding end and being oriented substantially orthogonally to the second outer surface, most of the volume of each of the second plurality of metal posts being located beneath the second outer surface, the protruding end of each of the second plurality of metal posts protruding beyond the second outer surface,
 the second die being coupled to the first die in a stacked relation with the protruding end of each of the first plurality of metal posts contacting the protruding end of a corresponding one of the second plurality of metal posts.

2. The die assembly of claim 1, wherein the first plurality of metal posts contains at least one hundred thousand metal posts.

3. The die assembly of claim 1, wherein the protruding end of each of the first plurality of metal posts contacts the protruding end of a corresponding one of the second plurality of metal posts at a cold weld interface.

4. The die assembly of claim 1, wherein the first outer surface of the first die does not contact the second outer surface of the second die.

5. The die assembly of claim 1, wherein the first plurality of metal posts is composed of a metal taken from the group consisting of: aluminum, copper and tungsten.

6. The die assembly of claim 1, wherein one metal post of the first plurality of metal posts contacts one of the metal posts of the second plurality of metal posts, wherein said one metal post of the first plurality of metal posts makes physical contact with no conductor of the first die, and wherein said one metal post of the second plurality of metal posts makes physical contact with no conductor of the second die.

7. The die assembly of claim 1, wherein the protruding end of each of the first plurality of metal posts has a surface area of less than 0.35 square microns, and wherein the protruding end of each of the second plurality of metal posts has a surface area of less than 0.35 square microns.

8. The die assembly of claim 1, further comprising:
 a third die having a third plurality of metal posts, the third die having a substantially planar second outer surface, each of the third plurality of metal posts having a volume and a protruding end and being oriented substantially orthogonally to the third outer surface, most of the volume of each of the third plurality of metal posts being located beneath the third outer surface, the protruding end of each of the third plurality of metal posts protruding beyond the third outer surface,
 wherein the second die further comprises a fourth plurality of metal posts, the second die having a substantially planar fourth outer surface, the fourth outer surface being substantially parallel to the second outer surface, each of the fourth plurality of metal posts having a volume and a protruding end and being oriented substantially orthogonally to the fourth outer surface, most of the volume of each of the fourth plurality of metal posts being located beneath the fourth outer surface, the protruding end of each of the fourth plurality of metal posts protruding beyond the fourth outer surface,
 wherein the third die is coupled to the second die in a stacked relation with the protruding end of each of the third plurality of metal posts contacting the protruding end of a corresponding one of the fourth plurality of metal posts.

9. The die assembly of claim 8, wherein the third outer surface of the third die does not contact the fourth outer surface of the second die.

10. A method, comprising:
 (a) forming a first plurality of metal vias within a first die, the first die having a substantially planar first outer surface;
 (b) etching away a portion of each of the first plurality of metal vias to form a first plurality of metal posts, each of the first plurality of metal posts being oriented substantially orthogonally to the first outer surface and having a protruding end, the protruding end of each of the first plurality of metal posts lying beneath the first outer surface;
 (c) etching away a layer of the first die such that each protruding end of each of the first plurality of metal posts lies above the first outer surface;
 (d) forming a second plurality of metal vias within a second die, the second die having a substantially planar second outer surface;
 (e) etching away a portion of each of the second plurality of metal vias to form a second plurality of metal posts, each of the second plurality of metal posts being oriented substantially orthogonally to the second outer surface and having a protruding end, the protruding end of each of the second plurality of metal posts lying beneath the second outer surface;
 (f) etching away a layer of the second die such that each protruding end of each of the second plurality of metal posts lies above the second outer surface; and
 (g) stacking the second die on the first die such that the protruding end of each of the first plurality of metal posts contacts the protruding end of a corresponding one of the second plurality of metal posts.

11. The method of claim 10, wherein the etching of steps (b) and (e) involves a type of etching taken from the group consisting of: ion beam etching (IBE), plasma etching, reactive ion beam etching and wet etching.

12. The method of claim 10, wherein the etching of step (c) lowers the first outer surface to be below the protruding end of each of the first plurality of metal posts, and wherein the etching of (f) lowers the second outer surface to be below the protruding end of each of the second plurality of metal posts.

13. The method of claim 12, wherein at least steps (c), (f) and (g) are performed in an oxygen-free atmosphere.

14. The method of claim 13, wherein the first plurality of metal posts contains at least one hundred thousand metal posts.

15. The method of claim 13, wherein each of the first plurality of metal posts has a volume, and wherein, following the stacking, at least nine tenths of the volume of each of the first plurality of metal posts is located beneath the first outer surface.

16. The method of claim 13, wherein the first plurality of metal posts is composed of a metal taken from the group consisting of: aluminum, copper and tungsten.

17. The method of claim 13, further comprising:
polishing, after step (a) and before step (b), the first outer surface using chemical-mechanical polishing.

18. The method of claim 13, wherein the stacking involves applying pressure to compress the first die and the second die such that a cold weld is formed at an interface where the protruding end of each of the first plurality of metal posts contacts the protruding end of a corresponding one of the second plurality of metal posts.

19. The method of claim 18, wherein the first outer surface is brought closer to the second outer surface by the pressure applied to compress the first die and the second die, but wherein a gap remains between the first outer surface and the second outer surface.

20. The method of claim 18, wherein the first outer surface of the first die is brought in contact with the second outer surface of the second die by the pressure applied to compress the first die and the second die.

21. A die assembly, comprising:
a lower die having more than one hundred thousand metal posts, the lower die having a substantially planar outer surface, each of the metal posts of the lower die having a protruding end and being oriented substantially orthogonally to the outer surface of the lower die, the protruding end of each of the metal posts of the lower die protruding beyond the outer surface of the lower die; and
an upper die having more than one hundred thousand metal posts, the upper die having a substantially planar outer surface, each of the metal posts of the upper die having a protruding end and being oriented substantially orthogonally to the outer surface of the upper die, the protruding end of each of the metal posts of the upper die protruding beyond the outer surface of the upper die, the upper die being coupled to the lower die in a stacked relation with the protruding end of each of the metal posts of the lower die contacting the protruding end of a corresponding one of the metal posts of the upper die, wherein the outer surface of the lower die does not contact the outer surface of the upper die, and wherein the metal posts of the lower die maintain contact with the metal posts of the upper die when the upper die moves laterally relative to the lower die.

22. The die assembly of claim 21, wherein the area of each of the metal posts of the lower die where the plane of the outer surface of the lower die intersects the metal posts is less than 0.35 square microns.

23. The die assembly of claim 21, wherein at least one metal post of the metal posts of the lower die makes physical contact with no conductor of the lower die, and wherein one metal post of the metal posts of the upper die makes physical contact with no conductor of the upper die.

* * * * *